(12) United States Patent
Guo et al.

(10) Patent No.: US 8,497,970 B2
(45) Date of Patent: Jul. 30, 2013

(54) ARRAY STRUCTURE HAVING THIN FILM TRANSISTOR AND CONNECTING STRUCTURE FOR GATE LINE CHARGING AND MANUFACTURING METHOD THEREOF

(75) Inventors: Jian Guo, Beijing (CN); Weifeng Zhou, Beijing (CN); Xing Ming, Beijing (CN)

(73) Assignee: Beijing Boe Optoelectronics Technology Co., Ltd., Beijing (CN)

( * ) Notice: Subject to any disclaimer, the term of this patent is extended or adjusted under 35 U.S.C. 154(b) by 216 days.

(21) Appl. No.: 13/105,147

(22) Filed: May 11, 2011

(65) Prior Publication Data

US 2011/0278576 A1  Nov. 17, 2011

(30) Foreign Application Priority Data

May 14, 2010  (CN) .......................... 2010 1 0175990

(51) Int. Cl.
*G02F 1/1345* (2006.01)
*G02F 1/133* (2006.01)
*G09G 3/36* (2006.01)

(52) U.S. Cl.
USPC ............. 349/149; 349/33; 345/100; 257/59; 257/72

(58) Field of Classification Search
USPC ............. 349/33, 149; 345/100, 215; 257/59, 257/72
See application file for complete search history.

(56) References Cited

U.S. PATENT DOCUMENTS

2007/0164289 A1* 7/2007 Jung ............................... 257/72
2009/0185093 A1* 7/2009 Gao et al. ....................... 349/42

\* cited by examiner

*Primary Examiner* — Michael Caley
(74) *Attorney, Agent, or Firm* — Ladas & Parry LLP

(57) ABSTRACT

An array substrate comprises: a base substrate; a display area comprising gate lines and data lines formed on the base substrate, wherein a pixel electrode and a first thin film transistor are formed in each of pixel units defined by the gate lines and the data lines which are crossed with each other, and the gate lines comprises a first gate line and a second gate line; and a dummy area which is at the periphery of the display area, which comprises a second thin film transistor and a connecting structure for each gate line, wherein the first gate line and the second gate line are connected with each other through the second thin film transistor and the connecting structure for the first gate line.

14 Claims, 4 Drawing Sheets

ARRAY STRUCTURE HAVING THIN FILM TRANSISTOR AND CONNECTING STRUCTURE FOR GATE LINE CHARGING AND MANUFACTURING METHOD THEREOF

BACKGROUND

Embodiments of the invention relate to an array substrate and a manufacturing method thereof.

Currently liquid crystal displays have become the major kinds of flat plate displays, and thin film transistor liquid crystal displays (TFT-LCDs) have been prevailing in the market of the liquid crystal displays.

An array substrate is an important component of a liquid crystal display. FIG. 3 is a schematic structural diagram of an array substrate. As shown in FIG. 3, the array substrate comprises a display area 1 and a dummy area 2 which is located at the periphery of the display area 1. The array substrate comprises a base substrate 20, gate lines 11 and data lines 12 formed on the base substrate 20. The gate lines 11 and the data lines 12 cross with each other and define a plurality of pixel units. A first thin film transistor (TFT) 13 and a pixel electrode 14 are formed in each pixel unit. During line-by-line scanning for displaying, the gate lines 11 are applied with an On-voltage line by line on the array substrate. When a gate line 11 is applied with an On-voltage in scanning, the voltage over the gate line 11 is increased from an Off-voltage to the On-voltage gradually. When the voltage over the gate line 11 reaches the On-voltage, the data line 12 applies a voltage to the pixel electrode 14 through the first TFT 13 in each pixel unit, so that the voltage of the pixel electrode 14 will become equal to that over the data line 12. Subsequently, the voltage over the gate line 11 is decreased from the On-voltage to the Off-voltage, and the corresponding first TFT 13 is converted into an Off-state. The pixel electrode 14 stay at the voltage applied from the data line 12 until the next gate line 11 is applied with an On-voltage.

As for any of the gate lines 11, the charging time period of the gate line 11 comprises a voltage rising time period, a voltage holding time period and a voltage descending time period. During the voltage rising time period, the voltage over the gate line 11 is increased form the Off-voltage to the On-voltage; during the voltage holding time period, the On-voltage is held over the gate line 11; and during the voltage descending time, the voltage over the gate line 11 is decreased from the On-voltage to the Off-voltage. Generally, the Off-voltage is 0, so it is necessary for each gate line to increase the voltage from 0 to the On-voltage, which leads to a long charging time period.

SUMMARY

An embodiment of the invention provides an array substrate, comprising: a base substrate; a display area comprising gate lines and data lines formed on the base substrate, wherein a pixel electrode and a first thin film transistor are formed in each of pixel units defined by the gate lines and the data lines which are crossed with each other, and the gate lines comprises a first gate line and a second gate line; and a dummy area which is at the periphery of the display area, which comprises a second thin film transistor and a connecting structure for each gate line, wherein the first gate line and the second gate line are connected with each other through the second thin film transistor and the connecting structure for the first gate line.

Another embodiment of the invention provides A manufacturing method for an array substrate, comprising: Step 101, forming a gate metal layer on a base substrate, and patterning the gate metal layer by a patterning process so as to form gate lines, the gate lines comprising a first gate line and a second gate line; Step 102, forming a first thin film transistor, a second thin film transistors, and data lines on the base substrate after the step 101, the gate lines and the data lines being crossed with each other so as to define pixel units, the first thin film transistors being formed for each pixel unit in the display area, and the second TFTs being located within the dummy area which is at the periphery of the display area for each gate line; and Step 103, forming a pixel electrode within each pixel unit in the display area on the base substrate after the step 102, forming a connecting structure in the dummy area for each gate line, the first and second gate lines are connected with each other through the second thin film transistor and the connecting structure for the first gate line.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from the following detailed description.

BRIEF DESCRIPTION OF THE DRAWINGS

The present invention will become more fully understood from the detailed description given hereinafter and the accompanying drawings which are given by way of illustration only, and thus are not limitative of the present invention and wherein:

FIG. 1b is a cross-sectional view taken along line A-A in FIG. 1a.

FIG. 2b is a cross-sectional view taken along line B-B in FIG. 2a.

DETAILED DESCRIPTION

Hereinafter, embodiments will be described in detail with reference to the accompanying drawings so that the objects, technical solutions and advantages of the embodiments will become more apparent. It should be noted that the embodiments described below are merely a portion of but not all of the embodiments of the invention, and thus various modifications, combinations or alterations can be made on the basis of the described embodiments without departing from the spirit and scope of the invention.

First Embodiment

Figure 1A:
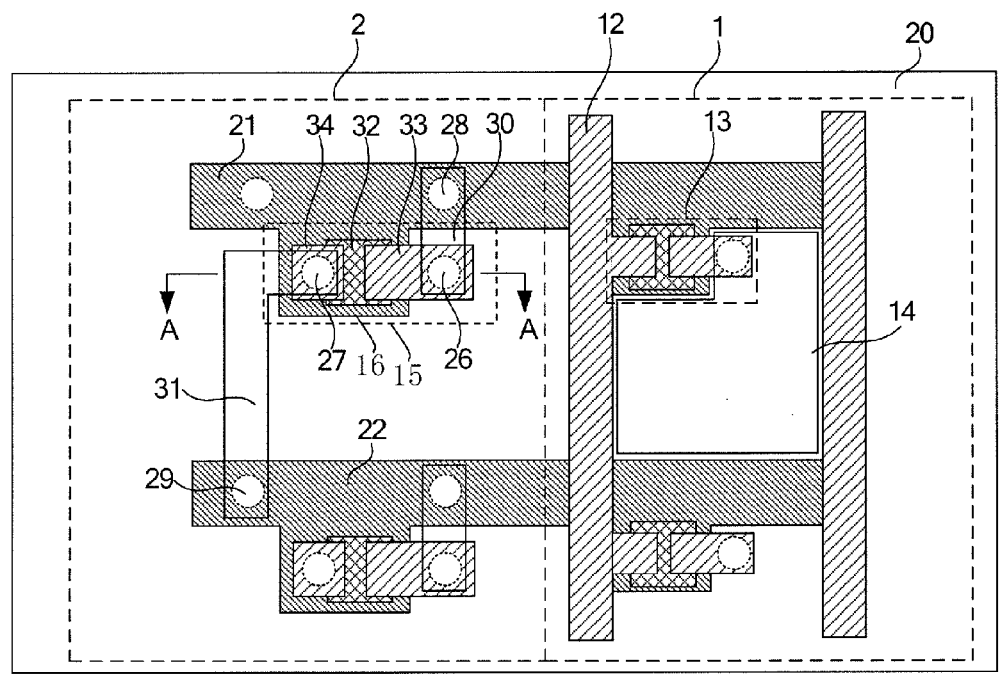
FIG. 1a is a schematic structural diagram of an array substrate provided in a first embodiment of the invention.
Figure 1B:
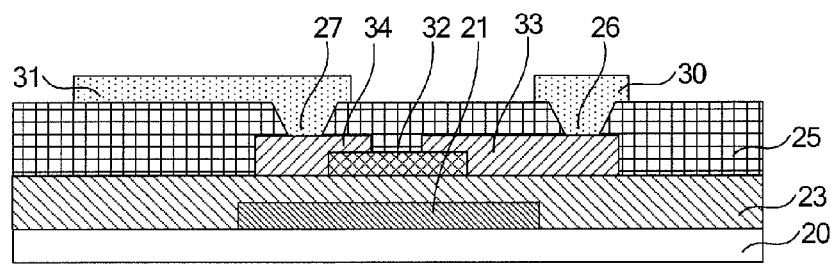

FIG. 1a is a schematic structural diagram of an array substrate provided in the first embodiment of the invention; and FIG. 1b is a cross-sectional view taken along line A-A in FIG. 1a. As shown in FIGS. 1a and 1b, the array substrate 100 comprises a base substrate 20, gate lines and data lines 12 formed on the base substrate 20. A pixel electrode 14 and a first thin film transistor (TFT) 13 are formed in each of the pixel units defined by the gate lines and the data lines 12, which are crossed with each other. The gate lines comprise a first gate, line 21 and a second gate line 22, which are arranged in adjacent rows. In the embodiment, the array substrate 100 comprises a display area 1 and a dummy area 2 which is located at the periphery of a display area 1. The pixel units are located within the display area 1. The array substrate 100 further comprises a second TFT 15 and a connecting structure in the dummy area 2 for each row. The first gate line 21 and the second gate line 22 in adjacent rows are connected with each other through the second TFT 15 and the connecting structure for the first gate line 21. The first TFTs 13 in the pixel units in the display area and the second TFTs 15 in the dummy area 2 are formed in same patterning processes.

Specifically, each connecting structure in the embodiment comprises a first connecting pattern 30 and a second connecting pattern 31. The first connecting pattern 30 connects the first gate line 21 with the source electrode of the second TFT 15 for the first gate line 21, and is provided on a same layer as that of the pixel electrodes 14. The second connecting pattern 31 connects the second gate line 22 with the drain electrode of the second TFT 15 for the first gate line 21, and is provided in a same layer as that of the pixel electrodes 14. In the embodiment, since the first connecting pattern 30 connects the first gate line 21 with the source electrode of the second TFT 15 for the first gate line 21 and the second connecting pattern 31 connects the second gate line 22 with the drain electrode of the second TFT 15 for the first gate line 21, the first gate line 21 and the second gate line 22 in the adjacent rows on the array substrate according to the embodiment are connected with each other through the first connecting pattern 30, the second TFT 15 for the first gate line 21, and the second connecting pattern 31.

Further, the array substrate according to the embodiment may comprise a first via hole 26, a second via hole 27, a third via hole 28 and a fourth via hole 29 for each row. The first via hole 26 is located over the source electrode of the second TFT 15; the second via hole 27 is located over the drain electrode of the second TFT 15; the third via hole 28 is located above the first gate line 21 or the second gate line 22; and the fourth via hole 29 is located above the first gate line 21 or the second gate line 22. The first connecting pattern 30 is filled in the first via hole 26 and the third via hole 28, so that it connects the gate line 21 or 22 with the source electrode of the second TFT 15 in the same row; the second connecting pattern 31 is filled in the second via hole 27 above the first gate line 21 and the fourth via hole 29 above the second gate line 22, so that it connects the drain electrode of the second TFT 15 for the first gate line 21 with the second gate line 22. In the embodiment, the first connecting pattern 30 connects the first gate line 21 with the source electrode 33 of the second TFT 15 through the first via hole 26 and the third via hole 28 above the first gate line 21, and the second connecting pattern 31 connects the second gate line 22 with the drain electrode 34 of the second TFT 15 for the first gate line 21 through the second via hole 27 above the first gate line 15 and the fourth via hole 29 above the second gate line 22; therefore, in the array substrate of the embodiment, the first gate line 21 and the second gate line 22 are connected with each other through the first connecting pattern 30, the second TFT 15 for the first gate line 21, and the second connecting pattern 31.

In the embodiment, the array substrate further comprises a gate insulating layer 23 which is formed on the gate lines. Specifically, the gate insulating layer 23 is formed on the first gate line 21 and the second gate line 22.

In the embodiment, a passivation layer 25 is further formed above the second TFTs 15. Specifically, the first and second connecting patterns 30, 31 are formed on the passivation layer 25 above the second TFTs 15. The first, second, third, and fourth via holes 26, 27, 28, and 29 are formed in the passivation layer 25.

There are a plurality of gate lines on the array substrate. In the embodiment in FIG. 1a, only one first gate line 21 and one second gate line 22 are shown as examples. The first gate line 21 may be any one of the gate lines. In the embodiment, the first gate line 21 and the second gate line 22 are provided to be adjacent to each other. That is to say, the second gate line 22 is the gate line which is next to the first gate line 21. In the embodiment, the first connecting pattern 30, the second TFT 15 and the second connecting pattern 31 are used to connect the adjacent gate lines. The embodiment is described by taking the first and second gate lines 21 and 22 as examples, and the structure and connecting relationship of other gate lines may be the same as those of the first and second gate lines 21 and 22, which will not be repeated herein.

In the embodiment, the second TFT 15 each comprises an active layer 32, a source electrode 33, a drain electrode 34 and a gate electrode 16 under the active layer 32. The gate electrode 16 is branched from the first gate line 21 and formed with the first gate line 21 integrally. The active layer 32 is over the gate insulating layer 23, and the source electrode 33 and the drain electrode 34 are above the active layer 32.

In the embodiment, during scanning of the gate lines, the voltage over the first gate line 21 is increased from an Off-voltage to an On-voltage gradually when the first gate line 21 is charged. The second TFT 15 for the first gate line 15 in the dummy area 2 is turned on when the voltage over the first gate line 21 is increased gradually, so that the voltage over the first gate line 21 can reach the second gate line 22 through the connecting structure and the second TFT 15. Thus, the voltage over the second gate line 22 is also increased from the Off-voltage gradually. When the voltage over the first gate line 21 reaches the On-voltage V, the voltage over the second gate line 22 reaches a preparatory voltage V'. The On-voltage V is the working voltage over the first gate line 21 which is larger than or equal to the threshold voltage Vth of the first TFTs 13 in the display area. Since there exists resistance in the connecting structure mentioned above, the preparatory voltage V' in the second gate line 22 is smaller than or equal to the threshold voltage Vth of the first TFTs 13 in the display area. When the voltage over the first gate line 21 reaches or is larger than the threshold voltage Vth of the first TFTs 13, the data lines 12 applies a voltage to the pixel electrodes 14 through the first TFTs 13 controlled by the first gate line 21 in the display area 1, so that the voltage in the pixel electrodes 14 in the pixel units controlled by the first gate line 21 is the same as that over the corresponding data lines 12. Subsequently, the first gate line 21 turns into an Off-state, and the voltage over the first gate line 21 is decreased from the On-voltage to the Off-voltage. During the voltage decreasing from the On-voltage to the Off-voltage over the first gate line 21, the second TFT 15 for the first gate line 21 in the dummy area 2 is turned off. Then the second gate line 22 is charged during the scanning. Since the voltage over the second gate line has reached the preparatory voltage V' when the first gate line 21 is charged, the voltage over the second gate line 22 is increased from the preparatory voltage V', rather than from the Off-voltage of 0, to the On-voltage when the second gate line 22 is charged. Thus, the voltage rising time period for the second gate line 22 is reduced so that the charging time period for the second gate line 22 is reduced.

The above description is given by taking the first and second gate lines 21 and 22 as examples; however, the embodiment according to the invention is not limited thereto and all the adjacent gate lines can be connected in a manner the same as that for the first and second gate lines 21 and 22. For example, when the first gate line 21 is turned on, the second gate line 22 may also be turned on through the connecting structure. In order to avoid that a third gate line which is connected with the second gate line 22 is also turned on through the structure between the second gate line and the third gate line, the resistance value of the connecting structure can be set to a predetermined one. It should be noted that, in the embodiment, the first, second and third gate lines are arranged in order on the array substrate, and there is also a connecting structure and a thin film transistor comprising a gate electrode formed integrally with the second gate line in the dummy area between the second gate line and the third gate line. The third gate line is a gate line which is connected with the second gate line through the connecting structure and the thin film transistor for the second gate line. Specifically, the equivalent resistance of each of the first, second and third gate lines is defined as R1, and the equivalent resistance of the connecting structures is defined as R2. When the voltage over the first gate line is V, the voltage over the second gate line V2 can be calculated as V2=V*R1(R1+R2), and the voltage over the third gate line V3 can be calculated as V3=V2*R1*(R1+R2)/(R1*R1+3R1*R2+R2*R2). It can be seen from the above equations that V2>V3.

In the specification, tuning-on of the gate line means that the voltage over the gate line reaches or is larger than the threshold voltage of the first Ms in display area, so that the first TFTs connected with the gate line can be turned on. Turning-off of the gate line in the Off-state means that the voltage over the gate line is smaller than the threshold voltage of the first TFTs, so that the first TFTs connected with the gate line are turned off.

When V2<Vth and V3<Vth, the first gate line can be turned on, and the second and third gate lines are in the Off-state, wherein Vth is the threshold voltage of the first TFTs 13. Therefore, when R1 is given or predetermined, the value of equivalent resistance R2 of the connecting structure can be calculated in the condition of V2<Vth and V3<Vth. The connecting structure with the resistance R2 can be made so that the second and third gate lines can be in the Off-state when the first gate line is turned on. Thus, when the voltage over the first gate line 21 in increased to the On-voltage V, the voltage over the second gate line 22 is increased from the Off-voltage to a preparatory voltage V" which is smaller than the threshold voltage Vth of the first TFTs 13. At the same time, a preparatory voltage V" over the third gate line is also smaller than the threshold voltage Vth of the first TFTs 13.

When V2>Vth and V3<Vth, the first and second gate lines can be turned on and the third gate line is in the Off-state, wherein Vth is the threshold voltage of the first TFT 13. Therefore, when R1 is given, the value of equivalent resistance R2 of the connecting structure can be calculated in the condition of V2>Vth and V3<Vth. The connecting structure with the resistance R2 can be made so that the first and second gate lines are turned on and the third gate line is in the Off-state when the first gate line is turned on. Thus, when the voltage over the first gate line 21 is increased to the On-voltage V, the voltage over the second gate line 22 is increased from the Off-voltage to a preparatory voltage V' which is larger than the threshold voltage Vth of the first TFT. However, a preparatory voltage V" over the third gate line is smaller than the threshold voltage Vth of the first TFT.

It can be known from the above equations for calculating the V2 and V3 that the equivalent resistance of the connecting structure can be set so as to obtain the various relationships between the voltages over different gate lines.

The array substrate according to the embodiment can be applied in a liquid crystal display with inverting configuration such as column inverting configuration or frame inverting configuration.

For the array substrate provided in the embodiment, a first gate line and a second gate line are formed on a base substrate, and a second TFT and a connecting structure are formed for the first gate line in a dummy area. The first gate line and the second gate line are connected with each other through the second TFT and the connecting structure for the first gate line. During scanning of the gate lines, when the first gate line is charged, the voltage can reach the second gate line through the connecting structure and a certain voltage is applied to the second gate line simultaneously. Subsequently, when the second gate line is charged, it is not necessary for the second gate line to increase from the Off-voltage of 0 to the On-voltage, which reduces the voltage rising time period for the second gate line. Therefore, the charging time period for the second gate line is reduced.

Second Embodiment

Figure 2A:
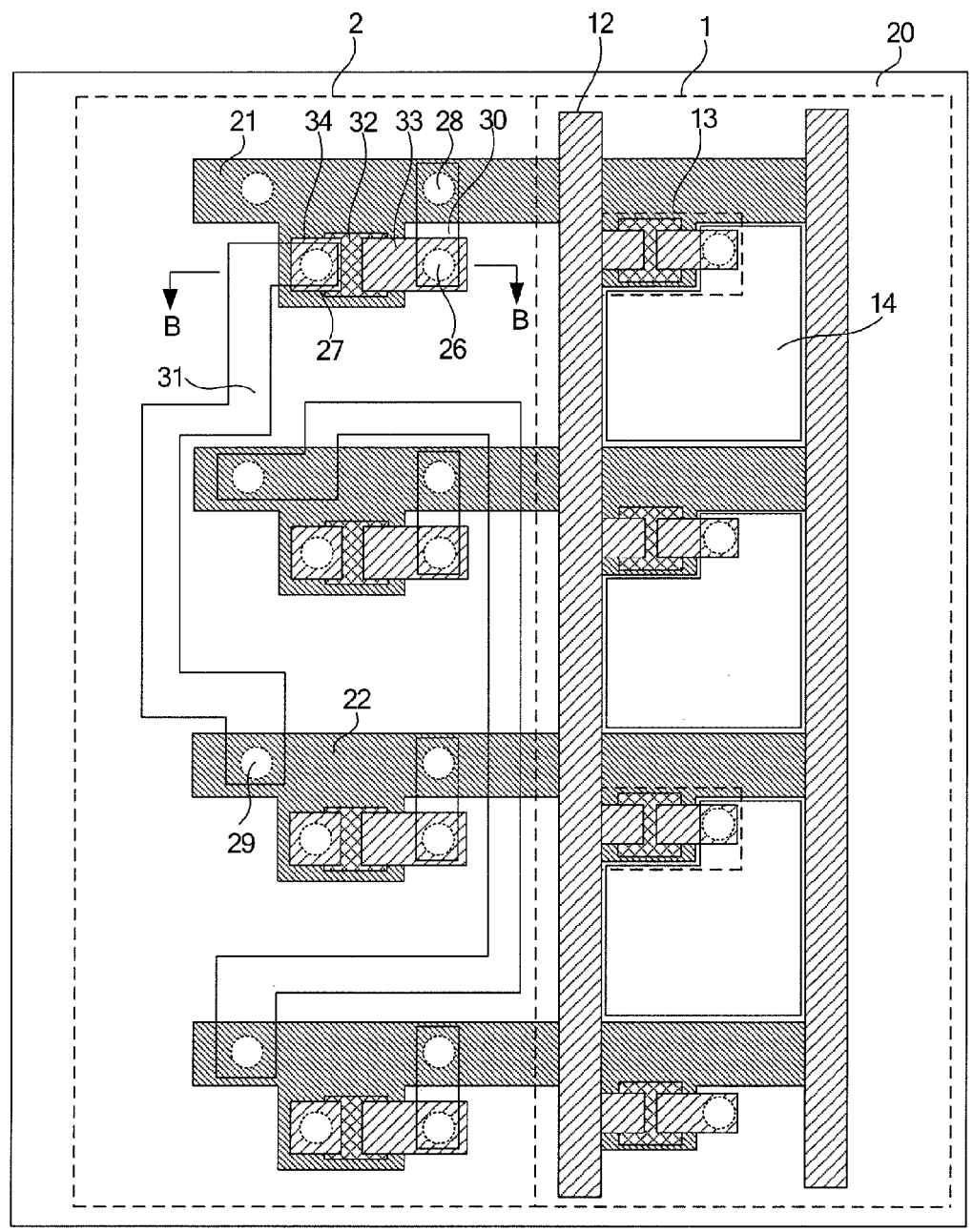
FIG. 2a is a schematic structural diagram of an array substrate provided in a second embodiment of the invention.
Figure 2B:
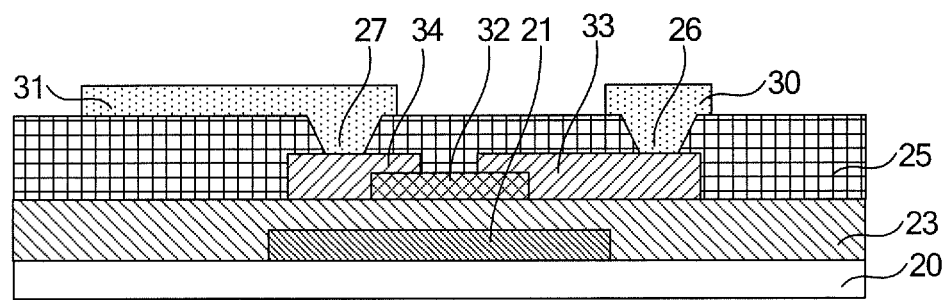
Figure 3:
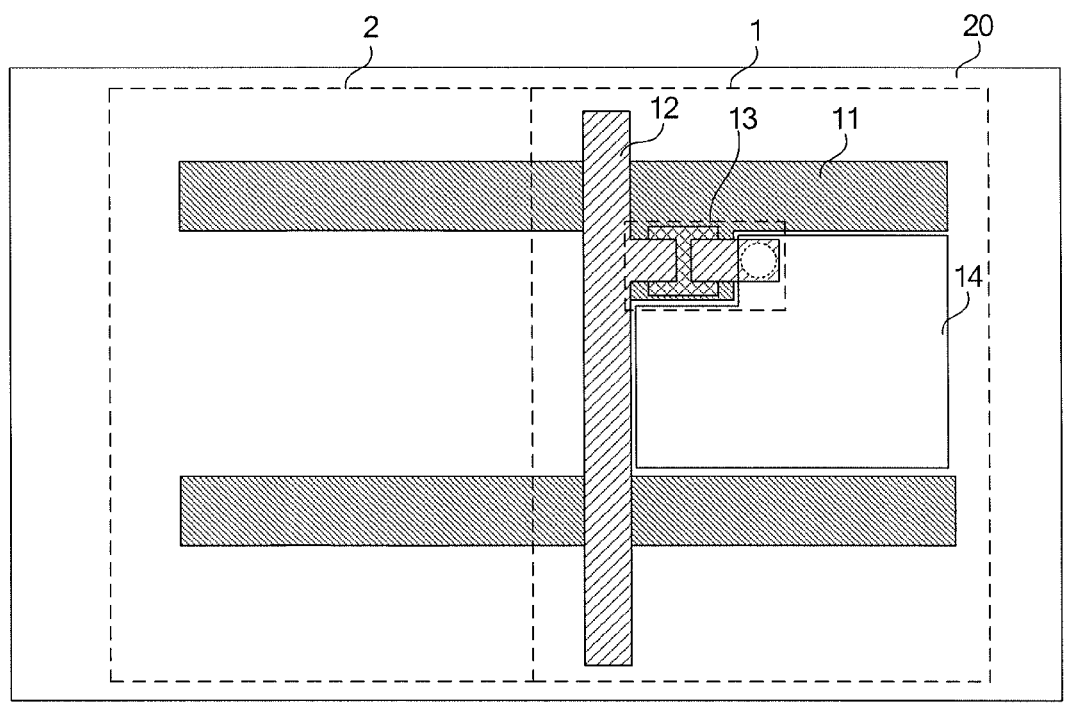
FIG. 3 is a schematic structural diagram of an array substrate.

FIG. 2a is a schematic structural diagram of an array substrate provided in the second embodiment of the invention; and FIG. 2b is a cross-sectional view taken along line B-B in FIG. 2a. As shown in FIGS. 2a and 2b, the array substrate comprises a base substrate 20, gate lines and data lines 12 formed on the base substrate 20. A pixel electrode 14 and a first thin film transistor (TFT) 13 are formed in each of the pixel units defined by the gate lines and the data lines 12 which cross with each other. The gate lines comprise a first gate line 21 and a second gate line 22. The array substrate 100 comprises a display area 1 and a dummy area 2 which is located at the periphery of a display area 1. The pixel units are located within the display area 1. The array substrate 100 further comprises a second TFT and a connecting structure in the dummy area 2 for each row. The first gate line 21 and the second gate line 22 are connected with each other through the second TFT and the connecting structure for the first gate line 21. The first TFTs 13 in pixel units in the display area and the second TFTs in the dummy area 2 are formed in same patterning processes.

For the array substrate of the second embodiment, the description is given by taking the first and second gate lines as examples. Similarly to the first embodiment, the array substrate of the second embodiment also have a plurality of gate lines, and, for example, there may be a third gate line which is connected with the second gate lines with the connecting structure and a thin film transistor for the second gate line which have the same configurations as those between the first and second gate lines.

In the second embodiment, the first gate line 21 and the second gate line 22 are not in adjacent rows, but there is provided another gate line interposed therebetween, as shown in FIG. 2a. In addition, if there is a third gate line, the second gate line and the third gate line are also connected with each other with another gate line interposed therebetween. That it to say, the gate lines provided in interleaved rows are connected with the connecting structure and the second TFT.

Except that the arrangement of the gate lines connected with the connecting structure and the second TFT is different from that of the gate lines in the first embodiment, the configuration of the array substrate of the second embodiment are the same as that in the first embodiment. The repeated description will be omitted herein.

Similarly, by setting the resistance of the connecting structure, the array substrate according to the second embodiment can also obtain the relationship between the voltages over each gate lines, and achieve the effect of reducing the time period for charging the gate lines.

Third Embodiment

A third embodiment of the invention provides a manufacturing method for an array substrate comprising the following steps.

Step 101, forming a gate metal layer on a base substrate, and patterning the gate metal layer by a patterning process so as to form gate lines, wherein the gate lines comprise a first gate line and a second gate line.

In the step 101, the gate lines are formed both in a display area and a dummy area which is at periphery of the display area on the base substrate simultaneously by the patterning process.

Step 102, forming first TFTs, second TFTs, and data lines on the base substrate after the step 101, the gate lines and the data lines cross with each other so as to define pixel units, wherein first TFTs are formed for each pixel unit in the display area, and the second TFTs are located within the dummy area which is at the periphery of the display area for the each gate line respectively.

In the embodiment, the first TFT and second TFT are formed simultaneously by the same patterning processes.

In the embodiment, the method further comprises forming a gate insulating layer on the gate lines before the step 102, the data lines, source/drain electrodes of the first TFTs and source/drain electrodes of the second TFTs formed in the step 102 are on the gate insulating layer, i.e., the data lines, source/drain electrodes of the first TFTs and source/drain electrodes of the second TFTs are formed on the gate insulating layer.

Step 103, forming a pixel electrode within each pixel unit in the display area on the base substrate after the step 102, forming a connecting structure for the first gate line in the dummy area, the first and second gate lines are connected with each other through the second TFT and the connecting structure for the first gate line.

In the embodiment, the connecting structure comprises a first connecting pattern and a second connecting pattern. The first connecting pattern connects the first gate line and the source electrode of the second TFT for the first gate line, and is formed simultaneously with the pixel electrodes in the pixel units by the same patterning process. The second connecting pattern connects the second gate line and the drain electrode of the second TFT for the first gate line, and is formed simultaneously with the pixel electrodes by the same patterning process.

In the embodiment, the method may further comprises: before the step 103, forming a first via hole and a second via hole over the source and drain electrodes of each second TFT, forming a third via hole above each gate line, and forming a fourth via hole above each gate line in the dummy area. The first connecting pattern is filled in the first via hole and the third via hole, so that it connects the first gate line with the source electrode of the second TFT for the first gate line. The second connecting pattern is filled in the second via hole of the second TFT for the first gate line and the fourth via hole for the second gate line, so that it connects the drain electrode of the second TFT for the first gate line with the second gate line. In this manner, the first and second gate lines are connected with each other through the connecting structure and the second TFT for the first gate line.

Further, in the embodiment, the method may comprise: before the step 103, forming a passivation layer above the first TFTs, the second TFTs and the data lines on the base substrate after the step 102. Specifically, the first and second connecting patterns may be formed on the passivation layer above the second TFTs. The first, second, third and fourth via holes is formed in the passivation layer.

In the embodiment, each second TFT may comprise an active layer, a source electrode, a drain electrode and a gate electrode under the active layer. The gate electrode is branched from the corresponding gate line and formed integrally with the gate line. The active layer is formed on the gate insulating layer, and the source/drain electrodes of the first and second TFTs are formed on the active layer. The first via hole is formed in the passivation layer over the source electrode of one second TFT, and the second via hole is formed in the passivation layer over the drain electrode f the second TFT. In the embodiment, the source electrodes and the drain electrodes of the TFTs and the data lines are formed simultaneously by the same patterning process.

In the embodiment, the first gate line and the second gate line are provided adjacently. Alternatively, the first gate line and the second gate line may be provided with another gate line interposed therebetween.

The manufacturing method for the array substrate according to the third embodiment can be used to manufacture the array substrates according to the above embodiments. Similarly, by setting the resistance of the connecting structure, the array substrate according to the second embodiment can also obtain the relationship between the voltages over each gate lines, and achieve the effect of reducing the time period for charging the gate lines.

In the embodiment of the invention mentioned above, the description is made with a bottom-gate-type TFT as an example. However, the embodiment of the invention can also adopt a top-gate-type TFT.

The invention being thus described, it will be obvious that the same may be varied in many ways. Such variations are not to be regarded as a departure from the spirit and scope of the invention, and all such modifications as would be obvious to those skilled in the art are intended to be included within the scope of the following claims.

What is claimed is:

1. An array substrate, comprising:
  a base substrate;
  a display area comprising gate lines and data lines formed on the base substrate, wherein a pixel electrode and a first thin film transistor are formed in each of pixel units defined by the gate lines and the data lines which are crossed with each other, and the gate lines comprises a first gate line and a second gate line; and
  a dummy area which is at the periphery of the display area, which comprises a second thin film transistor and a connecting structure for each gate line, wherein the first gate line and the second gate line are connected with each other through the second thin film transistor and the connecting structure for the first gate line,
  wherein the gate lines further comprises a third gate line, the third gate line is connected with the second gate line through an additional thin film transistor and an additional connecting structure for the second gate line, the additional thin film transistor and the additional connecting structure are of the same structure as that of the second thin film transistor and the connecting structure for the first gate line,
  when a voltage of V is applied to the first gate line, the voltage over the second gate line is V2 and the voltage over the third gate line is V3,
  wherein the resistance of the connecting structure and the additional connecting structure is set so that V2<Vth and V3<Vth, or V2>Vth and V3<Vth, wherein Vth is the threshold voltage of the first thin film transistor.

2. The array substrate of claim 1, wherein a gate electrode of the second thin film transistor is branched from the corresponding gate line and formed integrally with the gate line.

3. The array substrate of claim 1, wherein the resistance of the connecting structure is set so that when a voltage equal to or larger than the threshold voltage of the first thin film transistor is applied to the first gate line, the voltage applied to the second gate line through the connecting structure is smaller or equal to the threshold voltage of the first thin film transistor.

4. The array substrate of claim 1, wherein the first thin film transistors and the second thin film transistors are formed simultaneously with the same patterning processes.

5. The array substrate of claim 1, wherein the connecting structure comprises:
a first connecting pattern, connecting the first gate line and one of the source/drain electrodes of the second thin film transistor for the first gate line; and
a second connecting pattern, connecting the second gate line and the other of the source/drain electrodes of the second thin film transistor for the first gate line.

6. The array substrate of claim 5, further comprising:
a passivation layer on the second thin film transistors, wherein the connecting structure is located on the passivation layer and connected with first gate line, the second gate line and the source/drain electrodes of the second thin film transistor through the via holes formed in the passivation layer.

7. The array substrate of claim 1, wherein the first gate line and the second gate line are provided to be adjacent to each other.

8. The array substrate of claim 1, wherein the first gate line and the second gate line are provided with another gate line interposed therebetween.

9. A manufacturing method for an array substrate, comprising:
Step 101, forming a gate metal layer on a base substrate, and patterning the gate metal layer by a patterning process so as to form gate lines, the gate lines comprising a first gate line and a second gate line;
Step 102, forming a first thin film transistor, a second thin film transistors, and data lines on the base substrate after the step 101, the gate lines and the data lines being crossed with each other so as to define pixel units, the first thin film transistors being formed for each pixel unit in the display area, and the second TFTs being located within the dummy area which is at the periphery of the display area for each gate line; and
Step 103, forming a pixel electrode within each pixel unit in the display area on the base substrate after the step 102, forming a connecting structure in the dummy area for each gate line, the first and second gate lines are connected with each other through the second thin film transistor and the connecting structure for the first gate line,
wherein the gate lines further comprises a third gate line, the third gate line is connected with the second gate line through an additional thin film transistor and an additional connecting structure for the second gate line, the additional thin film transistor and the additional connecting structure are of the same structure as those of the second thin film transistor and the connecting structure for the first gate line,
when a voltage of V is applied to the first gate line, the voltage over the second gate line is V2 and the voltage in the third gate line is V3,
wherein the resistance of the connecting structure and the additional connecting structure is set so that V2<Vth and V3<Vth, or V2>Vth and V3<Vth, wherein Vth is the threshold voltage of the first thin film transistor.

10. The manufacturing method for the array substrate of claim 9, wherein the first thin film transistor and the second thin film transistor are formed simultaneously with the same patterning processes.

11. The manufacturing method for the array substrate of claim 10, wherein the connecting structure comprises a first connecting pattern and a second connecting pattern;
the first connecting pattern connects the first gate line and one of the source/drain electrodes of the second thin film transistor for the first gate line; and
the second connecting pattern connects the second gate line and the other of the source/drain electrodes of the second thin film transistor for the first gate line.

12. The manufacturing method for the array substrate of claim 11, further comprises:
before the step 103, forming a first via hole and a second via hole above the source/drain electrodes of each second thin film transistor, forming a third via hole above each gate line, and forming a fourth via hole above each gate line;
the first connecting pattern being filled in the first via hole and the third via hole for each gate line; and
the second connecting pattern being filled in the second via hole for first gate line and the fourth via hole for the second gate line.

13. The manufacturing method for the array substrate of claim 9, wherein the first gate line and the second gate line are provided to be adjacent to each other.

14. The manufacturing method for the array substrate of claim 9, wherein the first gate line and the second gate line are provided with another gate line interposed therebetween.

* * * * *